United States Patent [19]
Ejiri et al.

[11] Patent Number: 6,005,284
[45] Date of Patent: Dec. 21, 1999

[54] SEMICONDUCTOR DEVICE AND ITS MANUFACTURING METHOD

[75] Inventors: Hirokazu Ejiri; Hiroyuki Miwa; Hiroaki Ammo, all of Kanagawa, Japan

[73] Assignee: Sony Corporation, Tokyo, Japan

[21] Appl. No.: 08/861,404

[22] Filed: May 21, 1997

[30] Foreign Application Priority Data

May 23, 1996 [JP] Japan .................................. 8-151724

[51] Int. Cl.$^6$ .......................... H01L 27/082; H01L 29/00; H01L 27/102; H01L 29/80
[52] U.S. Cl. .......................... 257/588; 257/557; 257/554; 257/555; 257/556; 257/518; 257/532; 257/574; 257/576; 257/370; 257/256; 257/272; 257/273
[58] Field of Search .................................. 257/588, 587, 257/557, 554, 555, 556, 518, 525, 539, 256, 272, 273, 532, 574, 575, 576, 370

Primary Examiner—Steven H. Loke
Attorney, Agent, or Firm—Hill & Simpson

[57] ABSTRACT

A bipolar semiconductor device includes an npn transistor using a base outlet electrode in the form of a polycrystalline Si film and one or more other devices using an electrode in the form of a polycrystalline Si film supported on a common p-type Si substrate, the sheet resistance of the polycrystalline Si film forming the base outlet electrode of the npn transistor is decreased to two thirds of the sheet resistance of the polycrystalline Si film forming at least one electrode of at least one other device. The base outlet electrode can be made by first making the polycrystalline Si film on the entire surface of the substrate, then applying selective ion implantation of Si to a selective portion of the polycrystalline Si film for making the base outlet electrode to change it into an amorphous state, and then annealing the product to grow the polycrystalline Si film by solid-phase growth.

14 Claims, 11 Drawing Sheets

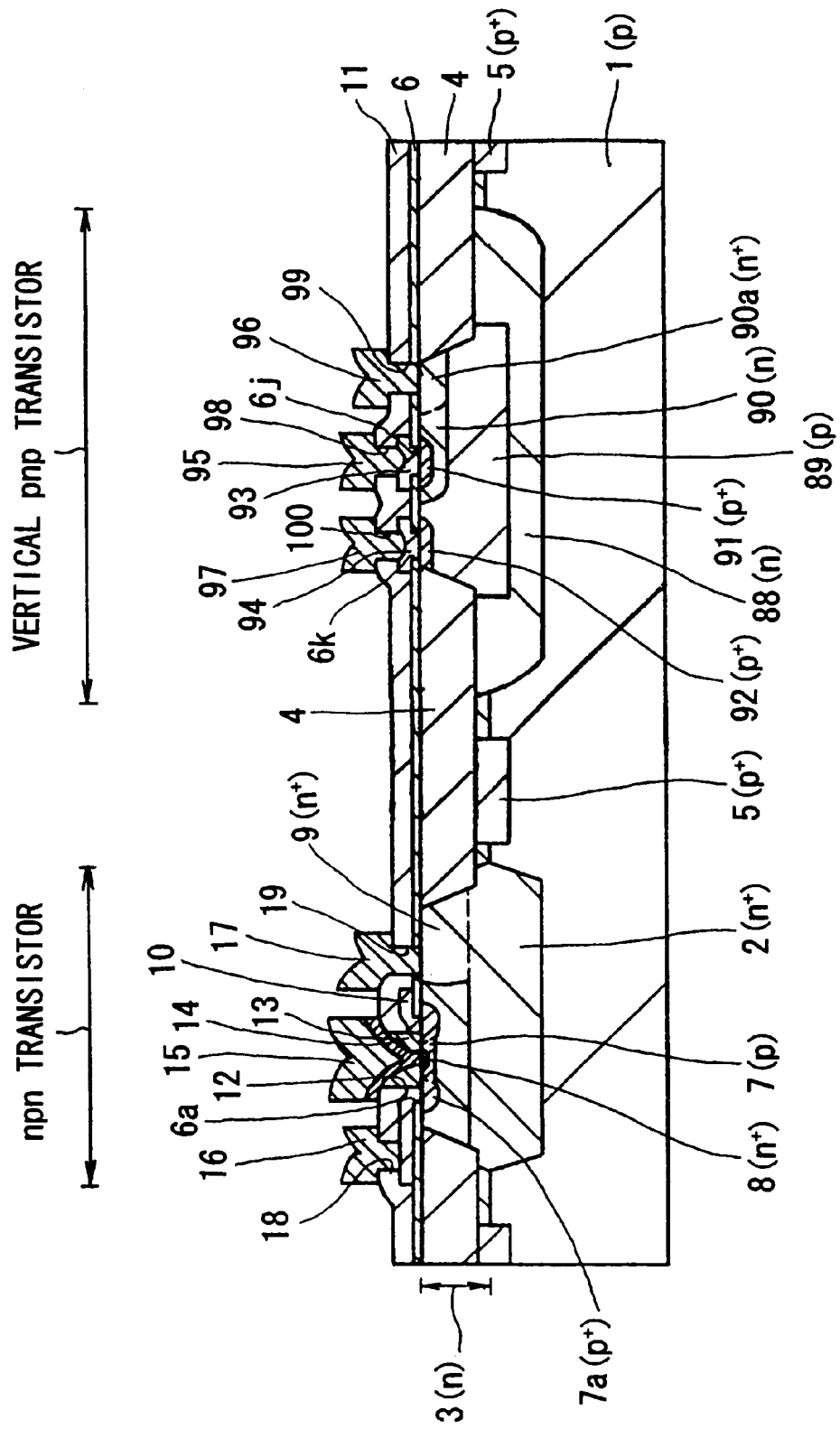

SEMICONDUCTOR DEVICE AND ITS MANUFACTURING METHOD

BACKGROUND OF THE INVENTION

1. Field of the Invention

The present invention relates generally to semiconductor devices and manufacturing methods and, more particularly, the present invention relates to a semiconductor device having both an npn transistor and one or more other devices which employ a plurality of polycrystalline silicon resistors on a common semiconductor substrate.

2. Description of the Related Art

In order to improve characteristics of bipolar transistors, a decrease in base resistance is important from the viewpoint of reduction of noise, improvement of the maximum frequency $f_{max}$, low power consumption, and others. In most bipolar transistors, the base outlet electrode is made of a polycrystalline silicon (Si) film. To reduce the base resistance of such a bipolar transistor using a base electrode in the form of a polycrystalline Si film, it is effective to decrease the sheet resistance of the polycrystalline Si film forming the base outlet electrode.

An effective method for decreasing the sheet resistance of a polycrystalline Si film is to increase the crystalline grain size and to improve the crystallographic properties. An effective method therefor is to break the crystal of the polycrystalline Si film made on a semiconductor substrate to change it into an amorphous state by ion implantation and to thereafter re-crystallize it by annealing for a long time at a low temperature.

It may be possible to use the above-mentioned method to decrease the sheet resistance of a polycrystalline Si film forming the base outlet electrode of a bipolar transistor. In most cases, however, the polycrystalline Si film forming the base outlet electrode is made simultaneously with other outlet electrodes of other devices. Therefore, the above method may degrade the reliability and the yields of semiconductor devices, depending on elements and electrodes formed therein, due to damage by ion implantation for changing polycrystalline Si films into an amorphous state and centralized stress caused by large-sized crystalline grains.

SUMMARY OF THE INVENTION

It is therefore an object of the invention to provide a semiconductor device and its manufacturing method which provides a structure supporting on a common semiconductor substrate both an npn transistor having a base outlet electrode in form of a polycrystalline silicon film and one or more other elements using an electrode in the form of a polycrystalline silicon film. The structure provides a significant decrease in base resistance of the npn transistor without degrading the reliability of other devices and the yield of the semiconductor devices.

According to a first aspect of the invention, a semiconductor device is provided having on a common semiconductor substrate such as an npn transistor which uses a base outlet electrode in the form of a polycrystalline silicon film and at least one other device which uses at least one electrode in the form of a polycrystalline silicon film, comprising:

the polycrystalline silicon film forming the base outlet electrode of the npn transistor having a sheet resistance not larger than two thirds of the sheet resistance of the polycrystalline film forming the other device.

According to a second aspect of the invention, a method of manufacturing is described which provides a semiconductor substrate having both an npn transistor which uses a base outlet electrode in form of a polycrystalline silicon film and at least one other device which uses at least one electrode in form of a polycrystalline silicon film, the polycrystalline silicon film forming the base outlet electrode of the npn transistor having a sheet resistance not larger than two thirds of the sheet resistance of the polycrystalline film forming the other device. The method comprises the steps of:

forming the polycrystalline silicon film for making the base outlet electrode of the npn transistor and the electrode of the other device on said semiconductor substrate;

applying selective ion implantation to a selective portion of the polycrystalline silicon film for making the base outlet electrode of the npn transistor and the electrode of the other device to change it into an amorphous state;

introducing an impurity as dopant to said polycrystalline silicon film; and recrystallizing the selective portion of the polycrystalline silicon film once changed into the amorphous state by annealing. A typical ion seed is $Si^+$. The annealing is typically conducted at a temperature of 550 to 650° C. for 20 to 600 minutes. A typical atmosphere for the annealing is a nitrogen ($N_2$) gas.

Typically, the sheet resistance of the polycrystalline silicon film forming the base outlet electrode of the npn transistor is 200 $\Omega/\square$ or less, and that of the polycrystalline silicon film forming the electrode of the other device is 300 $\Omega/\square$ or more.

In this case, the crystalline grain size of the polycrystalline silicon film forming the base outlet electrode of the npn transistor is 80 nm or more. The crystalline grain size of the polycrystalline silicon film forming the electrode of the other device is smaller than 80 nm. In a typical version, the crystalline grain size of the polycrystalline silicon film forming the base outlet electrode of the npn transistor is 90 to 500 nm, and the crystalline grain size of the polycrystalline silicon film forming the electrode of the other device is 20 to 70 nm. These crystalline grain sizes are values obtained by measurement using a transmission type electronic microscope. The grain sizes may be often greater when measured by an optical method such as ultraviolet absorption.

The semiconductor device according to the invention typically includes on the semiconductor substrate both an npn transistor and a device selected from the group consisting of an MIS capacitor, a lateral pnp transistor, a substrate pnp transistor, a p-channel JFET and vertical pnp transistor. Specifically, the other device may be a pnp transistor having an emitter outlet electrode as the electrode. More specifically, the other device may be a lateral pnp transistor having an emitter outlet electrode and a collector electrode as the electrodes. Alternatively, the other device may be a substrate pnp transistor having an emitter outlet electrode. Further, the other device may be a vertical pnp transistor having an emitter outlet electrode. In another version, the other device may be a MIS capacitor having a top electrode.

In an embodiment of the invention, the semiconductor device may include a MIS capacitor and a lateral pnp transistor as other devices. The MIS capacitor may include a top electrode. The lateral pnp transistor may have an emitter outlet electrode and a collector outlet electrode.

In another embodiment of the invention, the semiconductor device may include a MIS capacitor, a lateral pnp transistor and a substrate pnp transistor as other devices. It may include a top electrode for the MIS capacitor, emitter outlet electrode and collector electrode of the lateral pnp transistor, and emitter outlet electrode of the substrate pnp transistor.

In another embodiment of the invention, the semiconductor device may include a plurality of npn transistors that form a IIL (Integrated Injection Logic) device. It may include a substrate pnp transistor as the other device which has an emitter outlet electrode. Although the IIL device is made form a plurality of npn transistors, they may be considered as an npn transistor. In another embodiment of the invention, the other device may be a vertical pnp transistor, and the electrode may be an emitter outlet electrode of the vertical pnp transistor. In another embodiment of the invention, the semiconductor device includes an npn transistor, and a p-channel JFET and a MIS capacitor on the semiconductor substrate. The electrode may be the top electrode of the MIS capacitor.

When the semiconductor device includes a substrate pnp transistor, vertical pnp transistor or p-channel JFET in addition to the npn transistor, selective ion implantation is applied to a selective portion of the polycrystalline silicon film on the semiconductor substrate for making the base outlet electrode of the npn transistor and to another selective portion of the polycrystalline silicon film for making the collector electrode of the substrate pnp transistor, collector outlet electrode of the vertical pnp transistor or source outlet electrode and drain outlet electrode of the p-channel JFET.

In the semiconductor device having the above construction according to the invention, the base resistance of the npn transistor is greatly reduced as compared with a conventional device because the sheet resistance of the polycrystalline silicon film forming the base outlet electrode of the npn transistor is two thirds or less of the sheet resistance of the polycrystalline silicon film forming at least one electrode of at least one other device. Additionally, since portions of the polycrystalline silicon film forming electrodes of devices other than the npn transistor are not subjected to the process for increasing the crystalline grain size through an amorphous state by ion implantation, damage by ion implantation and centralized stress caused by increased size of crystalline grains do not occur, and the reliability and the yield can be increased.

In the method for manufacturing the semiconductor device, since the process includes a step of applying selective ion implantation to a selective portion of the polycrystalline silicon film for making the base outlet electrode of the npn transistor to change it into an amorphous state, and a step of annealing the product to re-crystallize the selective portion of the polycrystalline silicon film once changed to an amorphous state, the crystalline grain size can be sufficiently increased only in the selective portion of the polycrystalline silicon film which is changed to an amorphous state. As a result, the sheet resistance of the polycrystalline silicon film forming the base outlet electrode of the npn transistor can be decreased to two thirds or less of the sheet resistance of the polycrystalline silicon film for at least one electrode of at least one other device, and the base resistance of the npn transistor can be decreased significantly as compared with a conventional value.

Moreover, since portions of the polycrystalline silicon film forming electrodes of devices other than the npn transistor are not subjected to the process for increasing the crystalline grain size through an amorphous state by ion implantation, damage by ion implantation and centralized stress caused by increased size of crystalline grains do not occur, and the reliability and the yield can be increased.

BRIEF DESCRIPTION OF THE DRAWINGS

FIG. 11 is a cross-sectional view which illustrates a bipolar semiconductor device according to a fourth embodiment of the invention.

DESCRIPTION OF THE PREFERRED EMBODIMENTS

Figure 1:
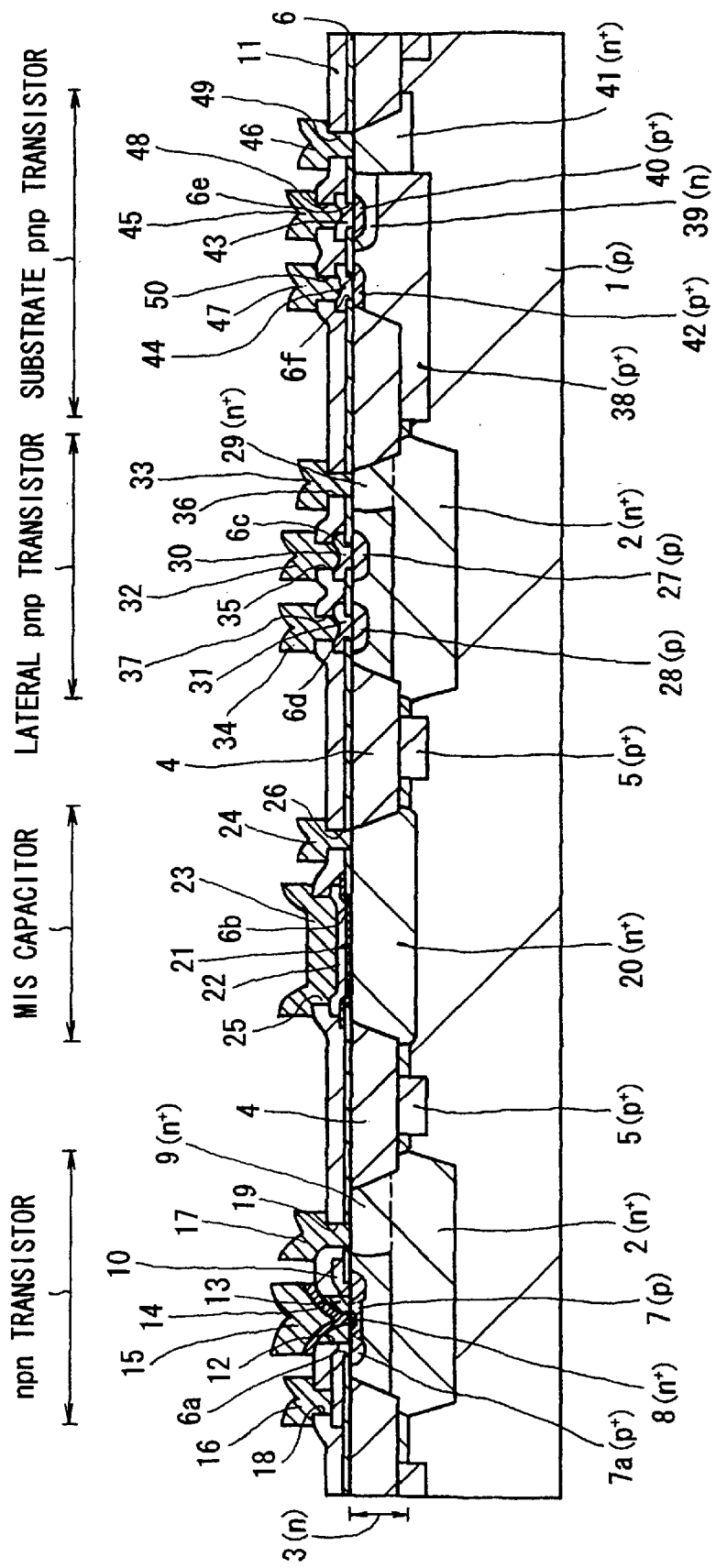
FIG. 1 is a cross-sectional view showing a bipolar semiconductor device according to a first embodiment of the invention.

Embodiments of the invention are explained below with reference to the drawings. For the sake of clarity, identical or equivalent elements or parts are labeled with common reference numerals in all figures of the embodiments.

FIG. 1 illustrates a bipolar semiconductor device according to a first embodiment of the invention. The bipolar semiconductor device illustrated here includes an npn transistor, MIS capacitor, lateral pnp transistor and substrate pnp transistor on a common semiconductor substrate. As shown in FIG. 1, the bipolar semiconductor device according to the first embodiment includes a selective n+-type buried layer 2 in the npn transistor region and the lateral pnp transistor region on a {111}-oriented p-type Si substrate 1, for example.

An n-type Si epitaxial layer 3 is formed on the p-type Si substrate 1. The n-type Si epitaxial layer 3 has a specific resistance of 0.3 to 5.0 Ω cm and a thickness of 0.5 to 2.5 μm. The n-type Si epitaxial layer 3 has selectively formed field insulation film 4, such as $SiO_2$ film, for isolation of devices. A p+-type channel stop region 5 is formed in the n-type Si epitaxial layer 3 and the p-type Si substrate 1 under the field insulation film 4. An insulation film 6, such as $SiO_2$ is formed on the surface of the p-type Si substrate 1 at a thickness of 50 to 200 nm.

In the npn transistor region, a p-type base region 7 is formed in the n-type Si epitaxial layer in portions surrounded by the field insulation film 4. Numeral 7a denotes a p+-type graft base sub-region.

An n+-type emitter region 8 is formed in the p-type base region 7. Also formed in the n-type Si epitaxial layer 3 is an n+-type collector outlet region 9 extending to the n+-type buried layer 2. A n+ type emitter region 8, p-type base region 7, n-type Si epitaxial layer 3 behaving as a collector region and n+-type collector outlet region 9 form an npn transistor are also formed as shown.

The insulation film 6 has an opening 6a above the p-type base region 7, and a base outlet electrode 10 in the form of a p+-type polycrystalline Si film doped with a p-type impurity such as B to a high concentration which extends through the opening 6a into contact with the graft base sub-region 7a of the p-type base region 7.

Numeral 11 denotes an inter-layer insulation film such as $SiO_2$. The inter-layer insulation film 11 may have a thickness of 200 to 500 nm, for example. An opening 12 large enough to involve the n+-type emitter region 8 is formed in the inter-layer insulation film 11 and the base outlet electrode 10 above the p-type base region 7. The opening 12 has a side wall on which a side wall spacer 13 made from $SiO_2$, for example. The n+-type emitter region 8 exposed to the area surrounded by the side wall spacer 13 contacts with an emitter outlet electrode 14 in the form of an n+-type polycrystalline Si film doped with an n-type impurity such as P or As, for example, at a high concentration. The emitter outlet electrode 14 is insulated from the base outlet electrode 10 by the side wall spacer 13. Numerals 15, 16 and 17 denote an emitter electrode, base electrode and collector electrode made from Al or an Al alloy, for example. The emitter electrode 15 contacts with the emitter outlet electrode 14, the base electrode 16 contacts the base outlet electrode 10 through an opening formed in the inter-layer insulation film 11, and the collector electrode 17 contacts the collector outlet electrode 9 through an opening 19 formed in the insulation film 6 and the inter-layer insulation film 11.

The MIS capacitor region has an n+-type region 20 extending to the p-type substrate 1 through the n-type Si epitaxial layer 3 surrounded by the field insulation film 4. The insulation film 6 has an opening 6b above the n+-type region 20. A dielectric film 21, such as $Si_3N_4$, having a thickness of 15 to 60 nm, for example, is formed on a portion of the n+-type region 20 aligned with the opening 6b. Formed on the dielectric layer 21 is a top electrode 22 in form of a p+-type polycrystalline Si film doped with a p-type impurity such as B at a high concentration. The top electrode 22, dielectric film 21 and n+-type region 20 form a MIS capacitor. Numerals 23 and 24 denote electrodes made from Al or an Al alloy, for example. The electrode 23 contacts the electrode 22 through an opening 25 made in the inter-layer insulation film 11, and the electrode 24 contacts the n+-type region 20 through an opening 26 made in the insulation film 6 and the inter-layer insulation film 11.

The lateral pnp transistor region includes a p-type emitter region 27 and a p-type collector region 28 formed in the n-type Si epitaxial layer 3 surrounded by the field insulation film 4. The p-type emitter region 27, the n-type Si epitaxial layer 3 behaving as an n-type base region and the p-type collector region 28 form a lateral pnp transistor. An n+-type base outlet region 29 extending to the n+-type buried layer 2 is formed in the n-type Si epitaxial layer 3. The insulation film 6 has an opening 6c above the p-type emitter region 27, and an emitter outlet electrode 30 in form of a p+-type polycrystalline Si film doped with a p-type impurity such as B at a high concentration contacts the p-type emitter region 27 through the opening 6c. The insulation film 6 another opening 6d above the p-type collector region 28, and a collector outlet electrode 31 in form of a p+-type polycrystalline Si film doped with a p-type impurity such as B at a high concentration contacts the p-type collector region 28 through the opening 6d. Numerals 32, 33 and 34 denote an emitter electrode, base electrode and collector electrode made from Al or an Al alloy, for example. The emitter electrode 32 contacts the emitter outlet electrode 30 through an opening 35 made in the inter-layer insulation film 11, the base electrode 33 contacts the n+-type base outlet region 29 through an opening made in the insulation film 6 and the inter-layer insulation film 11, and the collector electrode 34 contacts the p-type collector region 28 through an opening 37 made in the inter-layer insulation film 11.

The substrate pnp transistor region includes a p+-type collector region 38 extending through the n-type Si epitaxial layer 3 surrounded by the field insulation film 4 to bite into a lower portion of the field insulation film 4. Formed in the p+-type region 38 is an n-type base region 39, and formed in the n-type base region 39 is a p+-type emitter region 40. Also formed in the n-type Si epitaxial layer 3 is an n+-type base outlet region 41 connected to the n-type base region 39 and extending near to the p-type Si substrate 1. Formed in the p-type collector region 38 is a p+-type collector outlet region 42. The p+-type emitter region 40, n-type base region 39, n+-type base outlet region 41, p-type collector region 38 and p+-type collector outlet region 42 form a substrate pnp transistor.

The insulation film 6 has another opening 6e above the p+-type emitter region 40, and an emitter outlet electrode 43 in the form of a p+-type polycrystalline Si film doped with a p-type impurity such as B at a high concentration contacts the p+type emitter region 40 through the opening 6e. The insulation film 6 has another opening 6f above the p+-type collector outlet region 42, and a collector outlet electrode 44 in the form of a p+-type polycrystalline Si film doped with a p-type impurity such as B at a high concentration contacts the p+type collector outlet region 42. Numerals 45, 46 and 47 denote an emitter electrode, base electrode and collector electrode made from Al or an Al alloy, for example. The emitter electrode 45 contacts the emitter outlet electrode 43 through an opening 48 made in the inter-layer insulation film 11, the base electrode 46 contacts the base outlet region 41 through an opening 49 made in the insulation film 6 and the inter-layer insulation film 11, and the collector electrode 47 contacts the collector outlet electrode 44 through an opening 50 made in the inter-layer insulation film 11.

In the first embodiment, the p+-type polycrystalline silicon film forming the base outlet electrode 10 of the npn transistor and the collector outlet electrode 44 of the substrate pnp transistor has a thickness around 80 to 250 nm, for example, a crystalline grain size of 90 to 500 nm, and a sheet resistance as sufficiently low as 200 $\Omega/\square$. On the other hand, the p+-type polycrystalline silicon film forming the top electrode 22 of the MIS capacitor, emitter outlet electrode 30 and collector outlet electrode 31 of the lateral pnp transistor, and emitter outlet electrode 43 of the substrate pnp transistor has a similar thickness of 80 to 250 nm, but has a crystalline grain size of from 20 to 70 nm similar to conventional values and a sheet resistance as high as 300 $\Omega/\square$.

Set forth below is description relating to a process for fabricating the bipolar semiconductor substrate having the above construction according to the first embodiment.

Figure 2:
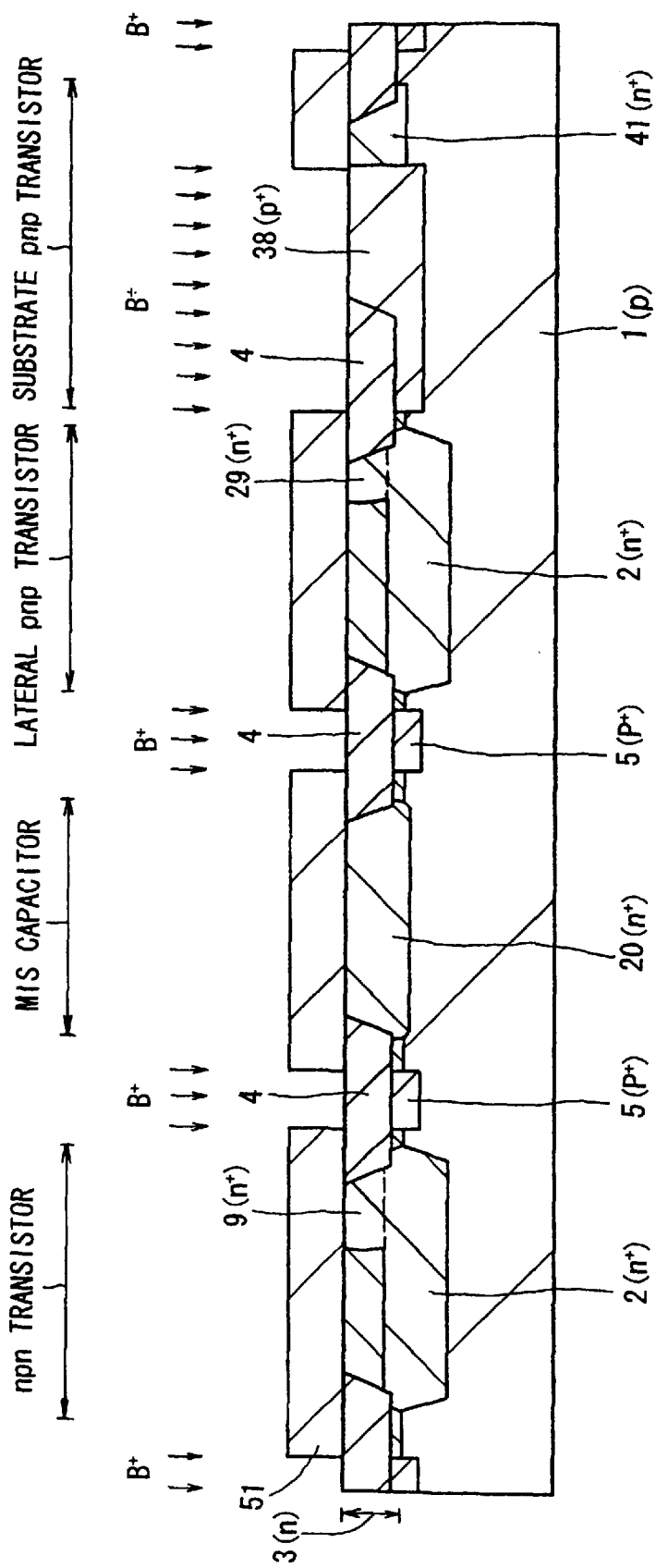
FIG. 2 is a cross-sectional view which illustrates a process for manufacturing the bipolar semiconductor device according to the first embodiment.

As shown in FIG. 2, the n+-type buried layer 2 is selectively formed in the npn transistor region and the lateral pnp transistor region on the p-type Si substrate 1 by ion implantation or thermal diffusion, for example. Next to be formed on the p-type Si substrate 1 is the n-type Si epitaxial layer 3. After that, the n-type Si epitaxial layer 3 is thermally oxidized by local oxidation (LOCOS), for example, to form the field insulation film 4. Then, P, As or other n-type impurities are doped into the n-type epitaxial layer 3 by ion implantation or thermal diffusion. The product results in including the n+-type collector outlet region 9 of the npn transistor, n+-type region 20 of the MIS capacitor, n+-type base outlet region 29 of the lateral pnp transistor and n+-type base outlet region 41 of the substrate pnp transistor. After that, a resist pattern 51 of a predetermined configuration is formed on the n-type Si epitaxial layer 3 by lithography. Using the resist pattern 51 as a mask, B or any other appropriate p-type impurity is ion-implanted. As a result, the p+-type channel stop region 5 and the p+-type collector region 38 of the substrate pnp transistor are formed under the field insulation film 4.

Figure 3:
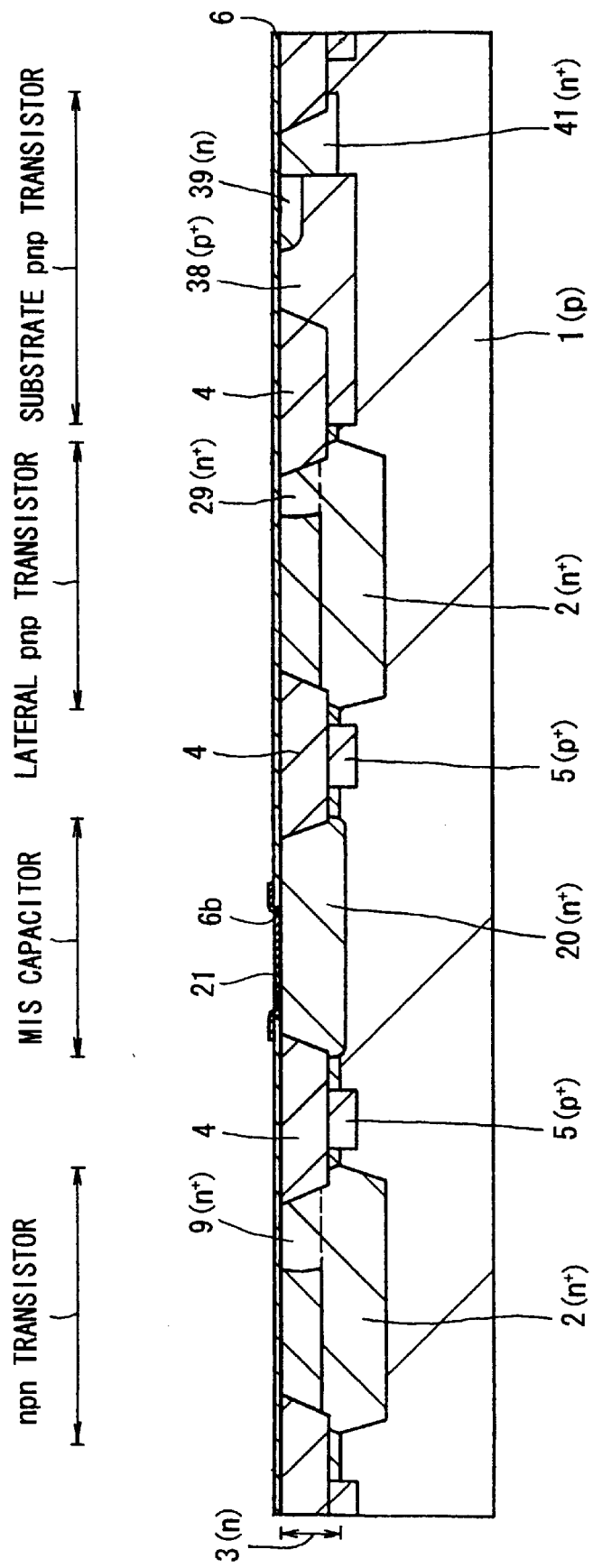
FIG. 3 is a cross-sectional view which illustrates a process for manufacturing the bipolar semiconductor device according to the first embodiment.

The resist pattern 51 is removed thereafter. As shown in FIG. 3, an n-type impurity such as P or As, for example, is ion-implanted to the p+-type base region 38 in the substrate pnp transistor region. After that, the insulation film 6 such as SiO2 film is formed on the entire surface by CVD, for example, and the insulation film 6 is selectively etched off in the MIS capacitor region by lithography and etching to form the opening 6b. Then, the dielectric film 21 such as $Si_3N_4$ film is formed on the entire surface by CVD, for example, and the dielectric film 21 is patterned into a predetermined configuration by lithography and dry or other type etching. The dielectric film 21 may be retained on the entire surface without patterning in certain cases.

Figure 4:
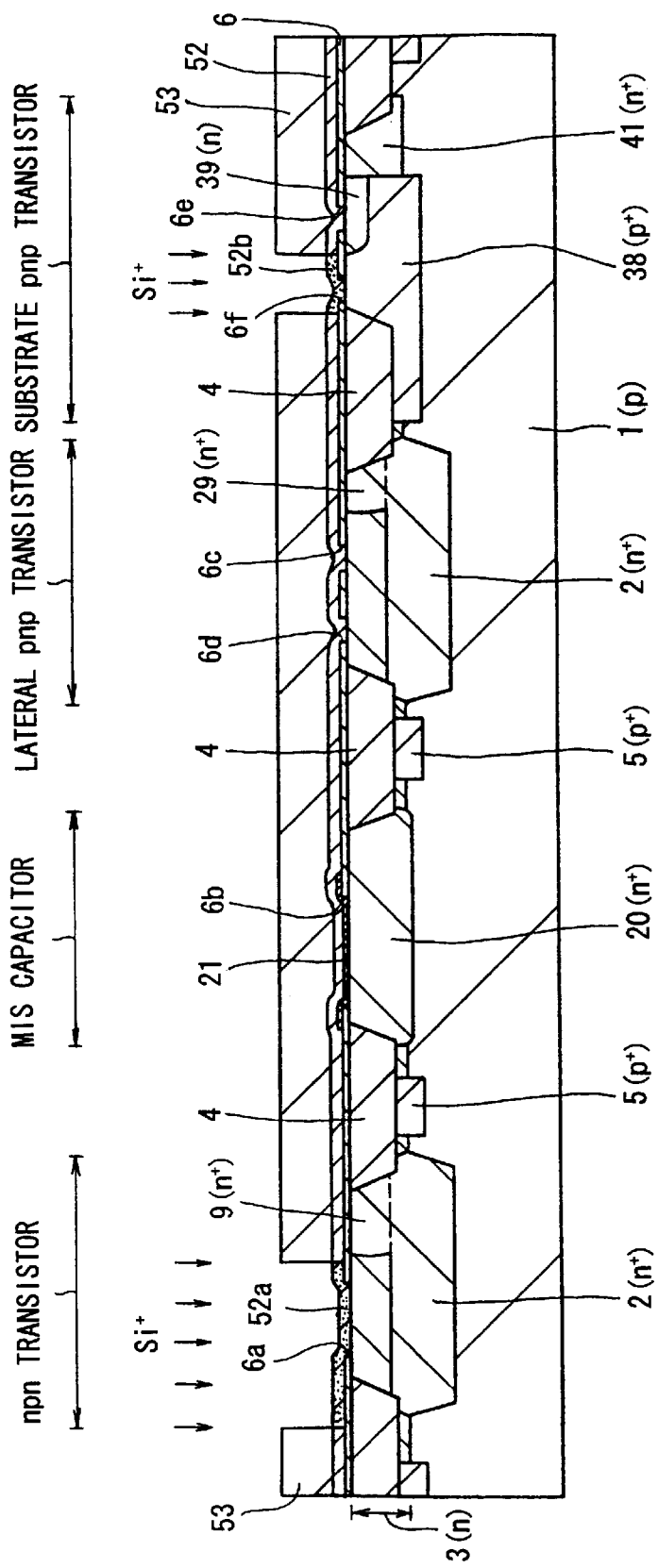
FIG. 4 is a cross-sectional view which illustrates a process for manufacturing the bipolar semiconductor device according to the first embodiment.

As shown in FIG. 4, selective portions of the insulation film 6, namely a predetermined portion of the npn transistor region, a predetermined portion of the lateral pnp transistor and a predetermined portion of the substrate pnp transistor region, are etched off to form openings 6a, 6c, 6d, 6e and 6f. After that, a polycrystalline Si film 52 is formed on the entire surface by CVD, for example. Then, a resist pattern 53 of a predetermined configuration is formed on the polycrystalline Si film 52 by lithography. Using the resist pattern 53 as a mask, selective ion implantation of $Si^+$ is applied to selective portions of the polycrystalline Si film 52 to break the crystal and change it into an amorphous state. For the $Si^+$ ion implantation energies of 30 to 100 keV, for example, and dose amounts of from $5.0 \times 10^{14}$ to $1.0 \times 10^{16}$ cm$^{-2}$. Numerals 52a and 52b denote portions changed into an amorphous state. The resist pattern 53 is removed thereafter.

Figure 5:
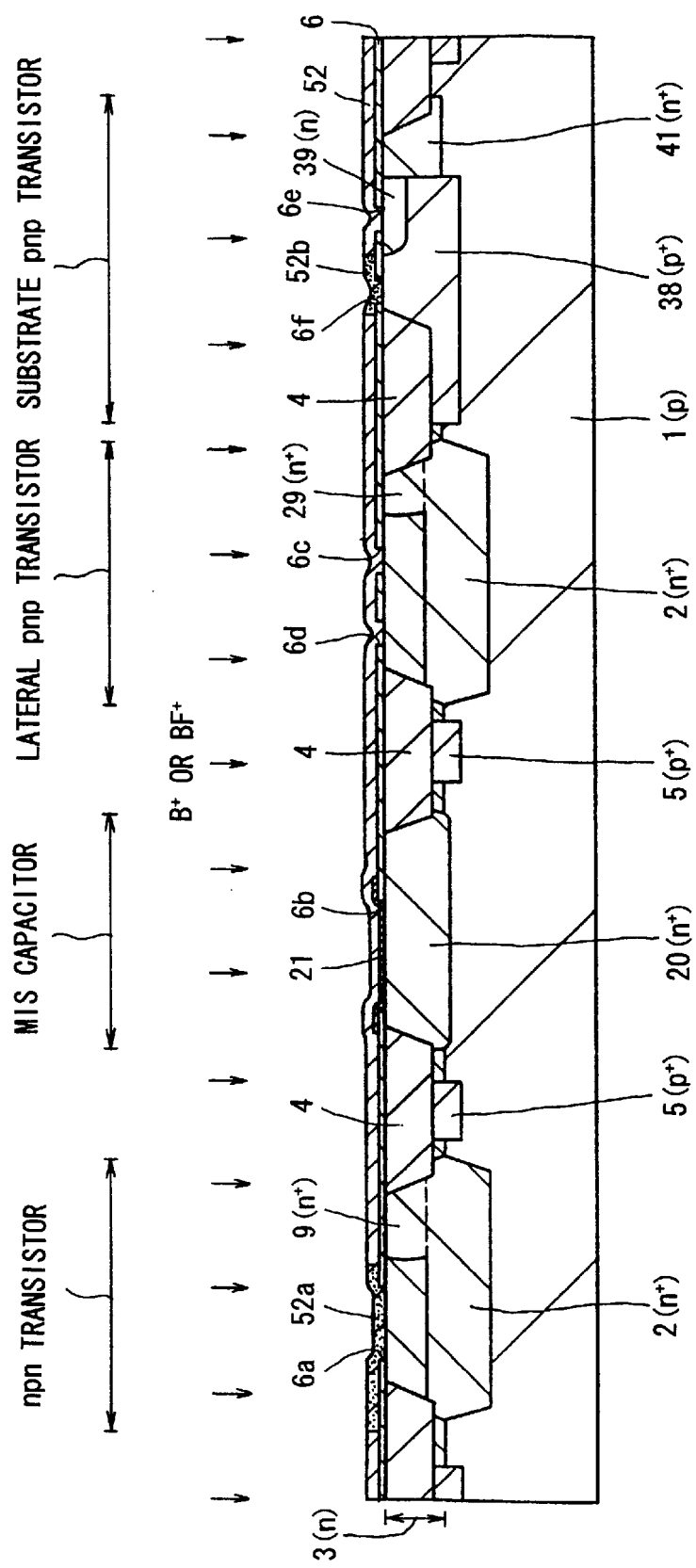
FIG. 5 is a cross-sectional view which illustrates a process for manufacturing the bipolar semiconductor device according to the first embodiment.

As shown in FIG. 5, $B^+$ or ions are ion-implanted at a high concentration onto the entire surface of the polycrystalline Si film 52 which is locally changed into an amorphous state. Conditions for the ion implantation are, for the use of $B^+$, energy of 5to 30 keV and a dose amount of from approximately $1.0 \times 10^5$ to approximately $1.0 \times 10^{16}$ cm$^{-2}$, for example, and for the use of $BF_2^+$, an energy of 10 to 60 keV and dose amount of from approximately $1.0 \times 10^{15}$ to approximately $1.0 \times 10^{16}$ cm$^{-2}$, for example. The ion implantation changes the polycrystalline Si film 52 into a p-type. When $BF_2^+$ is used for the ion implantation, F from the $BF_2^+$ crowds at boundaries of crystalline grains in the polycrystalline Si film 52 and prevents growth of crystalline grains during solid-phase growth by annealing executed later. To prevent this, it is effective to use $B^+$ instead of $BF_2^+$ for ion implantation at portions of the polycrystalline Si film 52 where increased size of crystalline grains is desired.

Figure 6:
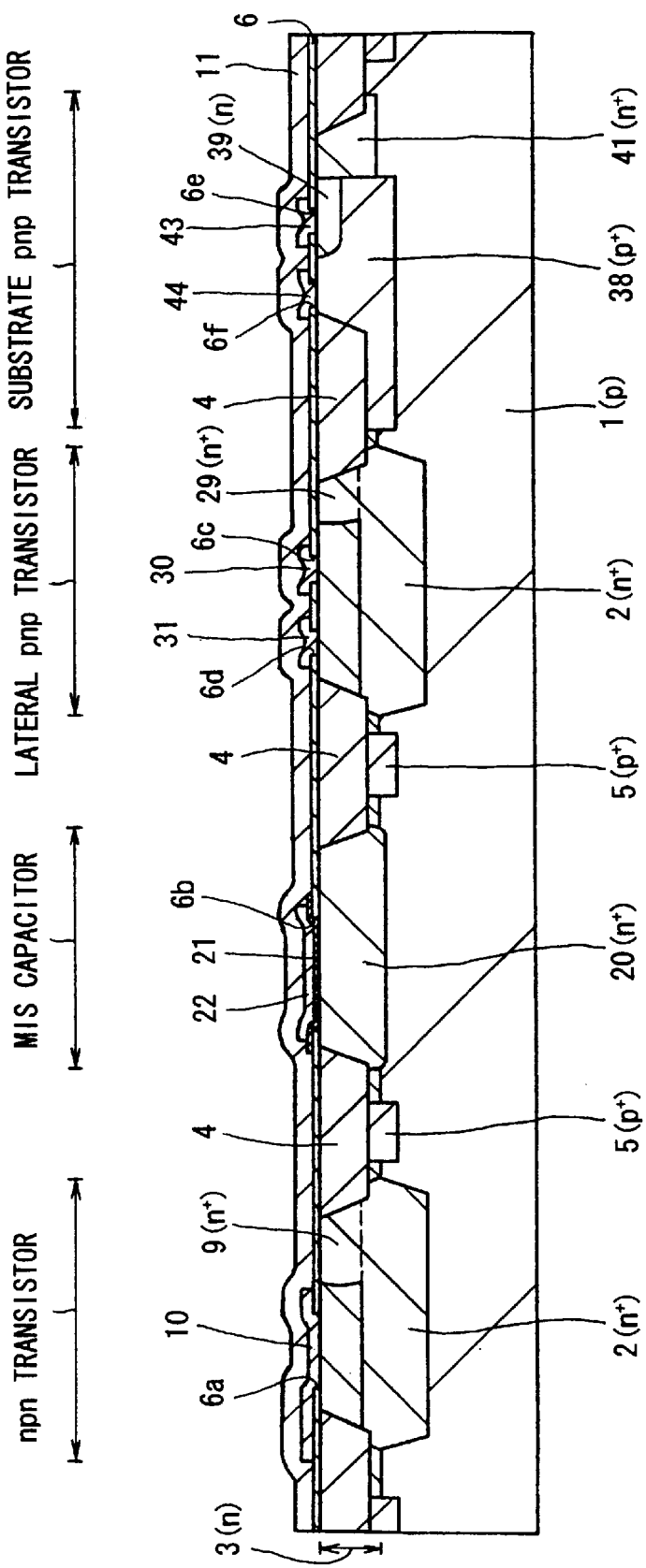
FIG. 6 is a cross-sectional view which illustrates a process for manufacturing the bipolar semiconductor device according to the first embodiment.

Next, as shown in FIG. 6, the p-type polycrystalline Si film 52 is patterned in to a predetermined configuration by lithography and etching. After that, the inter-layer insulation film 11 such as SiO2 is formed on the entire surface by CVD. Then the product is annealed in a $N_2$ atmosphere, for example, at a temperature of from 550° to 650° C. for 20 to 600 minutes to implement solid-phase growth. As a result, crystalline growth in the portions of the polycrystalline Si film 52 changed into an amorphous state is promoted to form a polycrystal with large grain size as compared with the other portions. Thus, the crystalline grain size becomes as large as 90 to 500 nm, for example, and the sheet resistance decreases to 200 Ω/□ or less, for example. On the other hand, the crystalline grain size of the other portions of the polycrystalline Si film 52 is as small as 20 to 70 nm like in the conventional device, and the sheet resistance is as high as 300 Ω/□ or more. The annealing for solid-phase growth and a later annealing may be done as a common, simultaneous step.

The above process results in the manufacture of the base outlet electrode 10 of the npn transistor, top electrode 22 of the MIS capacitor, emitter outlet electrode 30 and collector outlet electrode 31 of the lateral pnp transistor, and emitter outlet electrode 43 and collector outlet electrode 44 of the substrate pnp transistor.

Figure 7:
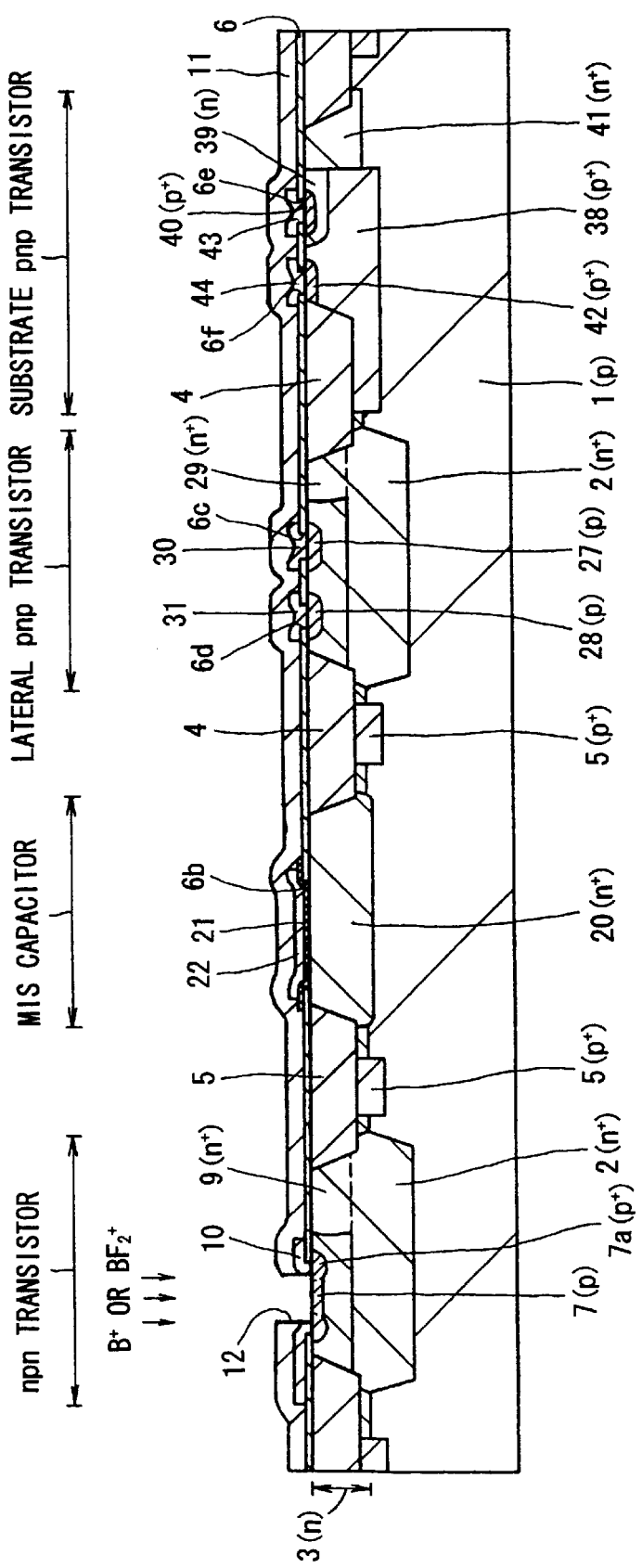
FIG. 7 is a cross-sectional view which illustrates a process for manufacturing the bipolar semiconductor device according to the first embodiment.

Next, as shown in FIG. 7, portions of the inter-layer insulation film 11 and the base outlet electrode 10 in the npn transistor region are etched off by lithography and etching to make the opening 12 such that an intrinsic base region area of p-type base region 7 is exposed to the opening 12. After that, using the inter-layer insulation film 11 and the base outlet electrode 10 as a mask, $B^+$ or $BF_2^+$ is ion-implanted into the n-type Si epitaxial layer 3 in the npn transistor region. Conditions of the ion implantation may be, for the use of $B^+$, an energy of from 5 to 100 keV and a dose amount of from approximately $5.0 \times 10^{11}$ to approximately $2.0 \times 10^{14}$ cm$^{-2}$, for example, and for the use of an energy of from 5 to 300 keV and dose amount of from approximately $1.0 \times 10^{15}$ cm$^{-2}$ to approximately $1.0 \times 10^{16}$ cm$^{-2}$, for example. The ion implantation results in making the p-type base region 7 in the n-type Si epitaxial layer 3. If necessary, P or another n-type impurity may be ion-implanted simultaneously with the above ion implantation to increase the impurity concentration of this portion of the n-type Si epitaxial layer 3 and decrease the collector resistance of the npn transistor. This is called SIC (Selective-Implanted Collector).

The product is then annealed to diffuse B from the base outlet electrode 10 of the npn transistor, emitter outlet electrode 30 and collector outlet electrode 31 of the lateral pnp transistor, emitter outlet electrode 43 and collector outlet electrode 44 of the substrate pnp transistor into the underlying layer. This results in forming a p+-type graft base region 7a of the npn transistor, p+-type emitter region 40 and p+-type collector outlet region 42 of the lateral pnp transistor. The annealing for diffusion of B may be done in a process common to a later annealing.

Figure 8:
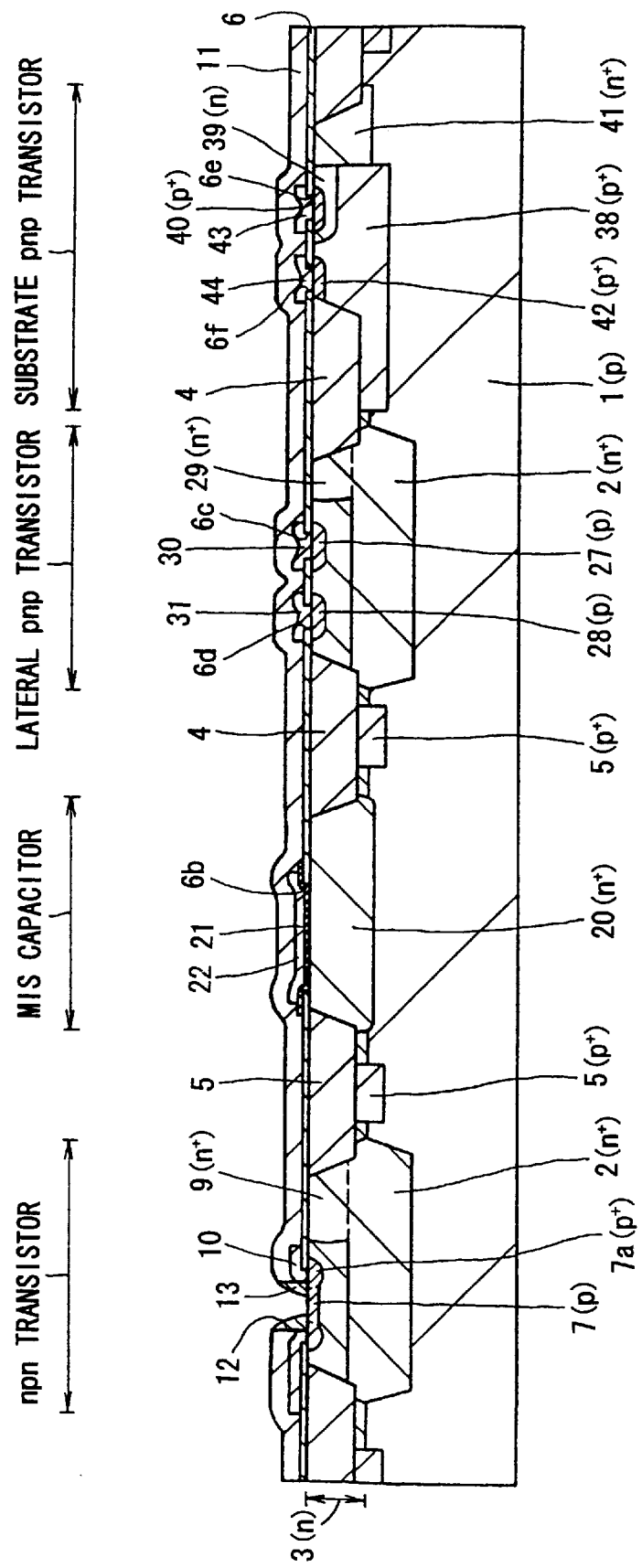
FIG. 8 is a cross-sectional view which illustrates a process for manufacturing the bipolar semiconductor device according to the first embodiment.

Next formed is a $SiO_2$ film of 400 nm to 1 μm, for example, on the entire surface by CVD, for example. The $SiO_2$ film is then etched back normal to the substrate surface by reactive ion etching (RIE), for example, to form the side wall spacer 13 along the side wall of the opening 12 made in the inter-layer insulation film 11 and the base outlet electrode 10 in the npn transistor region as shown in FIG. 8.

Then a polycrystalline Si film is formed on the entire surface by CVD, for example. The polycrystalline Si film is doped with P, As or another n-type impurity at a high concentration by ion implantation or thermal diffusion, for example, to decrease its resistance. It is also possible to directly form a polycrystalline Si film doped with an n-type impurity instead of doping the n-type impurity after forming the polycrystalline Si film. After that, the product is annealed to diffuse the n-type impurity from the polycrystalline Si film into the p-type base region 7 of the npn transistor. As a result, as shown in FIG. 1, the n+-type emitter region 8 is formed in the p-type base region 7. The polycrystalline Si film is then patterned into a predetermined configuration by lithography and etching to form the emitter outlet electrode 14 of the npn transistor.

The inter-layer insulation film 11 and the insulation film 6 are selectively etched off by lithography and etching, such as dry etching, to make openings 18, 19, 25, 26, 35, 36, 37, 48, 49 and 50. After that, an Al film or Al alloy film, for example, is deposited on the entire surface by sputtering or vacuum evaporation, for example, and the Al or Al alloy film is patterned by lithography or etching, such as RIE, to form the emitter electrode 15, base electrode 16 and collector electrode 17 of the npn transistor, electrode 23 and 24 of the MIS capacitor, emitter electrode 32, base electrode 33 and collector electrode 34 of the lateral pnp transistor, emitter electrode 44, base electrode 45 and collector electrode 46 of the substrate pnp transistor. After that, through some additional steps (not shown) of making an overlying inter-layer insulation film, contact holes and wiring, the desired bipolar semiconductor device is obtained.

As explained above, according to the first embodiment, since the base outlet electrode 10 of the npn transistor is made of the p+-type polycrystalline Si film with a low resistance, having a large crystalline grain size around 90 to 500 nm and a low sheet resistance of 200 Ω/□ or less, the base resistance of the npn transistor can be decreased to a much lower value than that of conventional devices.

As a result, the reduction of noise, improvement of $f_{max}$, low power consumption, and so forth, of the npn transistor can be achieved. Moreover, regarding devices other than the npn transistor, the process for increasing the size of crystalline grains through an amorphous state by ion implantation of $Si^+$ is effected only in the p+-type polycrystalline Si film forming the collector outlet electrode 44 of the substrate pnp transistor which is not affected adversely by implantation of Si+ ions which cause a change into an amorphous state. That is, since the process for increasing the size of crystalline grains through an amorphous state by ion implantation of Si+ is not affected at the emitter outlet electrode 43 of the substrate pnp transistor, top electrode 22 of the MIS capacitor, emitter electrode and collector electrode 31 of the lateral pnp transistor, the reliability and the yield of the MIS capacitor, lateral pnp transistor and substrate pnp transistor are not degraded.

Thus, a bipolar semiconductor device with a high performance, high reliability and high yield can be obtained.

Figure 9:
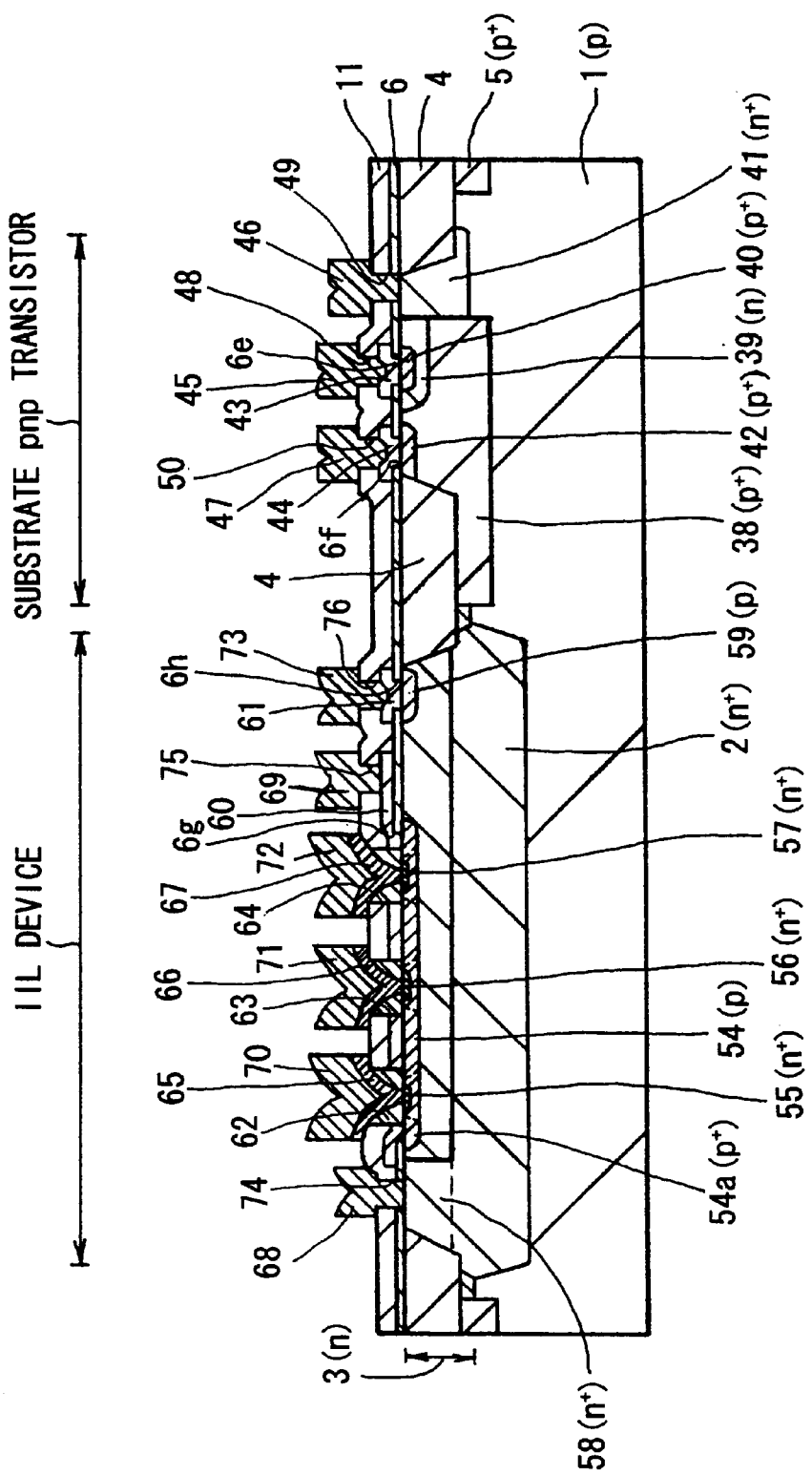
FIG. 9 is a cross-sectional view which illustrates a bipolar semiconductor device according to a second embodiment of the invention.

FIG. 9 illustrates a bipolar semiconductor device as a second embodiment of the invention. The bipolar semiconductor device illustrated here includes an IIL device made of three npn transistors, and a substrate pnp transistor on a common semiconductor substrate. Since the substrate pnp transistor in the second embodiment has the same construction as the substrate pnp transistor in the first embodiment, explanation thereof is omitted here.

As shown in FIG. 9, the IIL device region of the bipolar semiconductor device includes a p-type base region 54 in a part of the n-type Si epitaxial layer 3 surrounded by the field insulation film 4. Numeral 54a denotes a p+-type graft base region, for example. Formed in the p-type base region 54 are three n+-type collector regions 55, 56 and 57 isolated by a predetermined distance from each other. Also formed in the n-type Si epitaxial layer 3 is an n+-type emitter outlet region 58 extending to the n+-type buried layer 2. The n-type Si epitaxial layer behaving as an emitter region, n+-type emitter outlet electrode 58, p-type base region 54 and n+-type collector regions 55, 56, 57 form an IIL device. Further formed in the n-type Si epitaxial layer 3 is a p-type region 59.

The insulation film 6 has an opening 6g made above the p-type base region 54, and a base outlet electrode 60 in the form of a p+-type polycrystalline Si film doped with a p-type impurity such as B at a high concentration is brought into contact with the p-type base region 54 through the opening 6g. The insulation film 6 has another opening 6h above the p-type region 59, and an outlet electrode 61 in the form of a p+-type polycrystalline Si film doped with a p-type impurity such as B at a high concentration is brought into contact with the p-type region 59 through the opening 6h.

Openings 62, 63 and 64 large enough to involve the n+-type collector regions 55, 56 and 57 are made in the inter-layer insulation film 11 and the base outlet electrode 60 above the n+-type collector regions 55, 56 and 57. Side wall spacers 13 made of $SiO_2$, for example, are formed along side walls of these openings 62, 63 and 64. The n+-type collector regions 55, 56 and 57 exposed to regions encircled by the side wall spacers 13 are in contact with collector outlet electrodes 65, 66, 67 in the form of an n+-type polycrystalline Si film doped with a high-concentrate n-type impurity such as P or As, for example. Numerals 68 and 69 denote an emitter electrode and a base electrode made from Al or Al alloy, for example.

Numerals 70, 71, 72 denote collector electrodes made from Al or Al alloy, for example. Numeral 73 denotes an injection electrode made from Al or Al alloy, for example. The emitter electrode 68 contacts the n+-type emitter outlet region 58 through an opening 74 made in the insulation film 6 and the inter-layer insulation film 11. The base electrode 69 contacts the base outlet electrode 60 through an opening 75 made in the inter-layer insulation film 11. The collector electrodes 70, 71 and 72 contact the collector electrodes 65, 66, 67, respectively, and the injection electrode 73 contacts the outlet electrode 61 through an opening 76 made in the inter-layer insulation film 11.

In the second embodiment, the p+-type polycrystalline silicon film forming the base outlet electrode 60 and the outlet electrode 61 of the IIL device has a thickness around 80 to 250 nm, for example, a crystalline grain size as sufficiently large as 90 to 500 nm, and a sheet resistance as sufficiently low as 200 Ω/□ or less. On the other hand, the p+-type polycrystalline silicon film forming the emitter outlet electrode of the substrate pnp transistor has a similar thickness of 80 to 250 nm, but has a crystalline grain size as small as 20 to 70 nm similar to conventional values and a sheet resistance of 300 Ω/□ or more.

The bipolar semiconductor device according to the second embodiment can be made by the same process as used for making the bipolar semiconductor device according to the first embodiment. Explanation on the process is therefore omitted here.

The second embodiment provides the same advantages as obtained by the first embodiment in the bipolar semiconductor device having both the IIL device and the substrate pnp transistor on a common semiconductor substrate.

Figure 10:
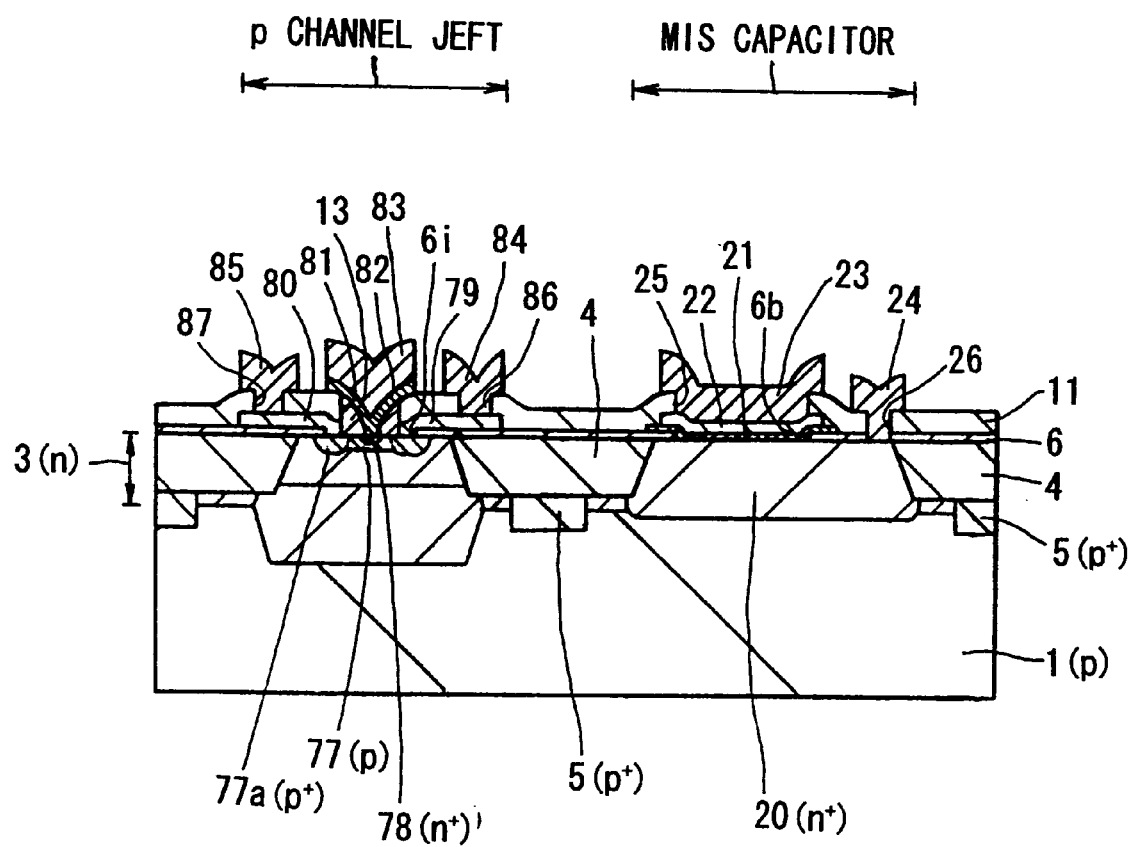
FIG. 10 is a cross-sectional view which illustrates a bipolar semiconductor device according to a third embodiment of the invention.

FIG. 10 shows a bipolar semiconductor device of a third embodiment of the invention. The bipolar semiconductor device of this embodiment includes an npn transistor, p-channel JFET and MIS capacitor on a common semiconductor substrate. Since the npn transistor and the MIS capacitor have the same constructions as those of the first embodiment, explanation thereof is omitted here. Illustration of the npn transistor, however, is omitted from FIG. 10.

As shown in FIG. 10, the p-channel JFET region of the bipolar semiconductor device according to the third embodiment includes a p-type channel region 77 in a part of the n-type Si epitaxial layer 3 surrounded by the field insulation film 4. Numeral 77a denotes a high-concentrated impurity portion. Formed in the p-type channel region 77 is an n+-type gate region 78.

The insulation film 6 has an opening 6i made above the p-type channel region 77, and a source outlet electrode 79 and a drain outlet electrode 80 in the form of a p+-type polycrystalline Si film doped with a p-type impurity such as B at a high concentration are brought into contact with the high-concentrated impurity portion 77a at one end of the p-type channel region 77 and the high-concentrated impurity portion at the opposite end, respectively.

An opening 81 large enough to involve the n+-type gate region 78 is made above the p-type channel region 77. Formed on the side wall of the opening 81 is a side wall spacer 13 made of SiO$_2$, for example. The n+-type gate region 78 exposed to the region encircled by the side wall spacer 13 is in contact with a gate outlet electrode 82 in the form of an n+-type polycrystalline Si film doped with an n-type impurity such as P or As at a high concentration. Numerals 83, 84, 85 denote a gate electrode, source electrode and drain electrode, respectively, which are made from Al or Al alloy. The gate electrode 83 contacts the gate outlet electrode 82, the source electrode 84 contacts the source outlet electrode 79 through an opening made in the inter-layer insulation film 11, and the drain electrode 85 contacts the drain outlet electrode 80 through an opening 87 made in the inter-layer insulation film 11.

In the third embodiment, the p+-type polycrystalline silicon film forming the base outlet electrode 10 of the npn transistor, source outlet electrode 79 and drain outlet electrode 80 of the p-channel JFET has a thickness around 80 to 250 nm, for example, a crystalline grain size of from 90 to 500 nm, and a sheet resistance as low as 200 $\Omega/\square$ or less. On the other hand, the p+-type polycrystalline silicon film forming the top electrode 22 of the MIS capacitor has a similar thickness of 80 to 250 nm, but has a crystalline grain size as small as 20 to 70 nm similar to conventional values and a sheet resistance of 300 $\Omega/\square$ or more.

The bipolar semiconductor device according to the third embodiment can be made by the same process used for making the bipolar semiconductor device according to the first embodiment. Explanation on the process is omitted therefore here.

The third embodiment provides the same advantages obtained by the first embodiment in the bipolar semiconductor device having the npn transistor, p-channel JFET and MIS capacitor.

FIG. 11 shows a bipolar semiconductor device as a fourth embodiment of the present invention. The bipolar semiconductor device of this embodiment includes an npn transistor and a vertical pnp transistor on a common semiconductor substrate. Since the npn transistor in the fourth embodiment has the same construction as that of the first embodiment, explanation thereof is omitted here.

As shown in FIG. 11, the vertical transistor region in the bipolar semiconductor device according to the fourth embodiment includes an n-type pocket region 88 in boundary portions of the p-type Si substrate 1 and the n-type Si epitaxial layer 3, and a p-type collector region 89 is formed in the n-type pocket region 88. Formed in the p-type collector region 89 is an n-type base region 90. Numeral 90a denotes an n+-type base outlet portion, for example. A p+-type emitter region 91 is formed in the n-type base region 90, and a p+-type collector outlet region 92 is formed in the p-type collector region 89. The p+-type emitter region 91, n-type base region 90, p-type collector region 89 and p+-type collector outlet region 92 form a vertical pnp transistor.

The insulation film 6 has an opening 6j made above the p+-type emitter region 91, and an emitter outlet electrode 93 in the form of a p+-type polycrystalline Si film doped with a p-type impurity such as B at a high concentration is brought into contact with the p+-type emitter region 91 through the opening 6j. The insulation film has another opening 6k above the p+-type collector outlet region 92, and a collector outlet electrode 94 in the form of a p+-type polycrystalline Si film doped with a p-type impurity such as B at a high concentration is brought into contact with the p+-type collector outlet region 92 through the opening 6k. Numerals 95, 96, 97 denote an emitter electrode, base electrode and collector electrode made from Al of Al alloy, for example. The emitter electrode 95 contacts the emitter outlet electrode 93 through an opening 98 made in the inter-layer insulation film 11, the base electrode 96 contacts the base outlet portion 90a of the p-type base region 90 through an opening 99 made in the insulation film 6 and the inter-layer insulation film 11. The collector electrode 97 contacts the collector outlet electrode 94 through an opening 100 made in the inter-layer insulation film 11.

In the fourth embodiment, the p+-type polycrystalline silicon film forming the base outlet electrode 10 of the npn transistor and the collector outlet electrode 94 of the vertical pnp transistor has a thickness around 80 to 250 nm, for example, a crystalline grain size of 90 to 500 nm, and a sheet resistance as low as 200 $\Omega/\square$ or less. On the other hand, the p+-type polycrystalline silicon film forming the emitter outlet electrode 93 of the vertical pnp transistor has a similar thickness of 80 to 250 nm, but has a crystal-line grain size of 20 to 70 nm similar to conventional values and a sheet resistance of 300 $\Omega/\square$ or more.

The bipolar semiconductor device according to the fourth embodiment can be made by the same process as used for making the bipolar semiconductor device according to the first embodiment. Explanation on the process is therefor omitted here.

The fourth embodiment provides the same advantages as obtained by the first embodiment in the bipolar semiconductor device having the npn transistor and the vertical pnp transistor on the common semiconductor substrate.

Although the invention has been shown and described with respect to preferred embodiments thereof, it should be understood that the invention is not limited to the illustrated examples but includes various changes or modifications within the spirit and scope of the invention.

For example, numerical values, materials and methods suggested in the description of the embodiments are exemplary only, and other numerical values, materials and methods may be employed.

Moreover, in the first embodiment, the step of changing the polycrystalline Si film 52 by ion implantation of Si and the step of changing it into a p-type by ion implantation of B+ or BF$_2$+ may be done in the opposite sequence. In the step for the changing into a p-type by ion implantation, if necessary, another ion implantation may be done by using the resist pattern obtained by lithography as a mask to vary the impurity concentration from one outlet electrode portion to another.

The invention is applicable to various types of semiconductor devices, other than those explained with the first to fourth embodiments, which may include various combinations of devices used in the first to fourth embodiments.

Although the third embodiment has been explained as being a bipolar semiconductor device having an npn transistor, p-channel JFET and MIS capacitor, a great decrease in source resistance and drain resistance can be attained by a decrease in sheet resistance of the source outlet electrode 79 and the drain outlet electrode 80 of the p-channel JFET even when the npn transistor is not used.

As described above, the semiconductor device according to the invention promises a great decrease in base resistance of an npn transistor without degrading the reliability and the yield of other devices by decreasing the sheet resistance of a polycrystalline silicon film forming the base outlet electrode of the npn transistor to two thirds of the sheet resistance of a polycrystalline silicon film forming at least one electrode of at least one other device.

The method for manufacturing a semiconductor device according to the invention provides a great decrease in base resistance of an npn transistor without degrading the reliability and the yield of other devices by using a step of selective ion implantation to a selective portion of a polycrystalline silicon film for making a base outlet electrode portion of the npn transistor to change it into an amorphous state, and the step of annealing the product to re-crystallize the polycrystalline silicon film in the amorphous state.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. A semiconductor device comprising:
   a common semiconductor substrate;
   an npn transistor having a base outlet electrode formed of a first polycrystalline silicon film and at least one other device having at least one electrode formed of a second polycrystalline silicon film, wherein:
   said first polycrystalline silicon film forming the base outlet electrode of said npn transistor has a sheet resistance not larger than two thirds of the sheet resistance of said second polycrystalline film forming said other device electrode.

2. The semiconductor device according to claim 1, wherein said sheet resistance of said first polycrystalline silicon film forming the base outlet electrode of said npn transistor is not larger than 200 $\Omega/\square$, and said sheet resistance of said second polycrystalline silicon film forming the electrode of said other device is not less than 300 $\Omega/\square$.

3. The semiconductor device according to claim 1, wherein said first polycrystalline silicon film forming the base outlet electrode of said npn transistor has a crystalline grain size not smaller than 90 nm, and said second polycrystalline silicon film forming the electrode of said other device has a crystalline grain size smaller than 70 nm.

4. The semiconductor device according to claim 1, wherein a crystalline grain size of said first polycrystalline silicon film forming the base outlet electrode of said npn transistor is in a range of from 90 to 500 nm, and a crystalline grain size of said second polycrystalline silicon film forming the electrode of said other device is in a range of from 20 to 70 nm.

5. The semiconductor device according to claim 1, wherein said other device is a pnp transistor, and said at least one electrode is an emitter outlet electrode of said pnp transistor.

6. The semiconductor device according to claim 1, wherein said other device is a lateral pnp transistor having an emitter outlet electrode and a collector outlet electrode that are formed of said second polycrystalline silicon film.

7. The semiconductor device according to claim 1, wherein said other device is a substrate pnp transistor, and said at least one electrode is an emitter outlet electrode of said substrate pnp transistor.

8. The semiconductor device according to claim 1, wherein said other device is a vertical pnp transistor, and said at least one electrode is an emitter outlet electrode of said vertical pnp transistor.

9. The semiconductor device according to claim 1, wherein said other device is a MIS capacitor, and said at least one electrode is a top electrode of said MIS capacitor.

10. The semiconductor device according to claim 1, wherein said semiconductor substrate supports thereon both said npn transistor and at least one device selected from the group consisting of a MIS capacitor, a lateral pnp transistor, a substrate pnp transistor and a vertical pnp transistor.

11. The semiconductor device according to claim 1, further comprising a MIS capacitor and a lateral pnp transistor as said at least one other device, said MIS capacitor having a top electrode as said at least one electrode, and said lateral pnp transistor having an emitter outlet electrode as said at least one electrode.

12. The semiconductor device according to claim 1, further comprising a MIS capacitor, a lateral pnp transistor and a substrate pnp transistor as said at least one other device, said MIS capacitor having a top electrode as said at least one electrode, said lateral pnp transistor having an emitter outlet electrode and a collector outlet electrode as said at least one electrode, and said substrate pnp transistor having an emitter outlet electrode as said at least one electrode.

13. The semiconductor device according to claim 1, further comprising a plurality of said npn transistors which form an integration injection logic device, and including a substrate pnp transistor as said other device, said substrate pnp transistor having an emitter outlet electrode as said at least one electrode.

14. The semiconductor device according to claim 1, further comprising a further pnp transistor, a p-channel JFET and a MIS capacitor on said semiconductor substrate, and wherein said at least one electrode is a top electrode of said MIS capacitor.

* * * * *